(12) United States Patent  
Ross (10) Patent No.: US 7,260,673 B1  
(45) Date of Patent: Aug. 21, 2007

(54) METHOD AND APPARATUS FOR VERIFYING THE INTEGRITY OF A CONTENT-ADDRESSABLE MEMORY RESULT

(75) Inventor: Mark A. Ross, San Carlos, CA (US)

(73) Assignee: Cisco Technology, Inc., San Jose, CA (US)

( * ) Notice: Subject to any disclaimer, the term of this patent is extended or adjusted under 35 U.S.C. 154(b) by 781 days.

(21) Appl. No.: 09/910,227

(22) Filed: Jul. 20, 2001

(51) Int. Cl.  
*G06F 12/00* (2006.01)

(52) U.S. Cl. .............................. 711/108; 365/49; 714/6

(58) Field of Classification Search ................ 711/108; 714/6; 365/49  
See application file for complete search history.

(56) References Cited

U.S. PATENT DOCUMENTS

| | | | |
|---|---|---|---|
| 3,648,254 A | 3/1972 | Beausoleil | |
| 4,065,756 A | 12/1977 | Panigrahi | ...................... 365/49 |
| 4,296,475 A | 10/1981 | Nederlof et al. | |
| 4,791,606 A | 12/1988 | Threewitt et al. | |
| 4,996,666 A | 2/1991 | Duluk, Jr. | ..................... 365/49 |
| 5,088,032 A | 2/1992 | Bosack | |
| 5,319,763 A | 6/1994 | Ho et al. | |
| 5,383,146 A | 1/1995 | Threewitt | |
| 5,440,715 A | 8/1995 | Wyland | |
| 5,450,351 A | 9/1995 | Heddes | |
| 5,453,999 A | 9/1995 | Michaelson et al. | ........ 714/805 |
| 5,481,540 A | 1/1996 | Huang | |
| 5,515,370 A | 5/1996 | Rau | |
| 5,740,171 A | 4/1998 | Mazzola et al. | |
| 5,841,874 A | 11/1998 | Kempke et al. | |
| 5,842,040 A * | 11/1998 | Hughes et al. | ................ 710/11 |
| 5,845,324 A * | 12/1998 | White et al. | ................ 711/128 |
| 5,898,689 A | 4/1999 | Kumar et al. | |
| 5,920,886 A | 7/1999 | Feldmeier | |
| 5,930,359 A | 7/1999 | Kempke et al. | |
| 5,956,336 A | 9/1999 | Loschke et al. | |
| 5,978,885 A | 11/1999 | Clark, II | |
| 6,000,008 A | 12/1999 | Simcoe | |

(Continued)

OTHER PUBLICATIONS

McAuley et al. "Fast Table Lookup Using CAMs", Networking: Foundation for the Future. IEEE , Mar. 28-Apr. 1, 1993, pp. 1382-1391 vol. 3.*

(Continued)

*Primary Examiner*—Jasmine Song  
(74) *Attorney, Agent, or Firm*—The Law Office of Kirk D. Williams (57) ABSTRACT

Methods and apparatus are disclosed for verifying the integrity of an index or result produced by a content-addressable or associated memory or other device. A pre-computed data protection field is stored, either as part of a returned index of a content-addressable memory or in a separate storage. In one implementation, a data protection operation is performed on all or part of the returned index and a comparison is made with a pre-computed data protection field. In one implementation, a copy of the masks employed by a ternary content-addressable memory and a set of pre-computed data protection fields are stored. A particular mask and pre-computed data protection field are selected based on the generated index. The original input value is then masked by the selected mask and provided to a data protection function. The result of this function is then compared to the selected pre-computed data protection field.

66 Claims, 8 Drawing Sheets

U.S. PATENT DOCUMENTS

| | | | |
|---|---|---|---|
| 6,041,389 A | 3/2000 | Rao | |
| 6,047,369 A | 4/2000 | Colwell et al. | |
| 6,061,368 A | 5/2000 | Hitzelberger | |
| 6,067,656 A | 5/2000 | Rusu et al. | 714/768 |
| 6,069,573 A | 5/2000 | Clark, II et al. | |
| 6,081,440 A | 6/2000 | Washburn et al. | |
| 6,091,725 A | 7/2000 | Cheriton et al. | |
| 6,097,724 A | 8/2000 | Kartalopoulos | |
| 6,134,135 A | 10/2000 | Andersson | |
| 6,137,707 A | 10/2000 | Srinivasan et al. | |
| 6,141,738 A | 10/2000 | Munter et al. | |
| 6,148,364 A | 11/2000 | Srinivasan et al. | |
| 6,154,384 A | 11/2000 | Nataraj et al. | |
| 6,175,513 B1 | 1/2001 | Khanna | |
| 6,181,698 B1 | 1/2001 | Hariguchi | |
| 6,199,140 B1 | 3/2001 | Srinivasan et al. | |
| 6,236,658 B1 | 5/2001 | Essbaum et al. | |
| 6,237,061 B1 | 5/2001 | Srinivasan et al. | |
| 6,240,003 B1 | 5/2001 | McElroy | |
| 6,243,667 B1 | 6/2001 | Kerr et al. | |
| 6,246,601 B1 | 6/2001 | Pereira | |
| 6,295,576 B1 | 9/2001 | Ogura et al. | |
| 6,307,855 B1 | 10/2001 | Hariguchi | |
| 6,377,577 B1 * | 4/2002 | Bechtolsheim et al. | 370/392 |
| 6,430,073 B1 | 8/2002 | Batson et al. | 365/49 |
| 6,510,509 B1 * | 1/2003 | Chopra et al. | 712/13 |
| 6,535,452 B2 | 3/2003 | Okuda et al. | 365/230.03 |
| 6,657,878 B2 | 12/2003 | Lien et al. | 365/49 |
| 6,700,827 B2 | 3/2004 | Lien et al. | 365/222 |
| 6,718,494 B1 | 4/2004 | Jamil et al. | 714/723 |
| 6,728,124 B1 * | 4/2004 | Ichiriu et al. | 365/49 |
| 6,732,227 B1 * | 5/2004 | Baumann | 711/108 |
| 7,100,097 B2 | 8/2006 | Patella et al. | |
| 2004/0015752 A1 | 1/2004 | Patella et al. | |
| 2004/0015753 A1 | 1/2004 | Patella et al. | |

OTHER PUBLICATIONS

Jon P. Wade and Charles G. Sodini, "A Ternary Content Addressable Search Engine," IEEE Journal of Solid-State Circuits, vol. 24, No. 4, Aug. 1989, pp. 1003-1013.

Teuvo Kohonen, Content-Addressable Memories, 1987, pp. 128-129 and 142-144, Springer-Verlang, New York.

Brian Dipert, ed., "Special-purpose SRAMs Smooth the Ride," EDN, Jun. 24, 1999, pp. 93-104.

"Extending the LANCAM Comparand," Application Brief AB-N3, Rev. 1.0a Draft, Music Semiconductors, Milpitas, CA, Sep. 30, 1998, 4 pages.

"Advantages of CAM in ASIC-Based Network Address Processing," Application Brief AB-N11, Rev. 1.2a Draft, Music Semiconductors, Milpitas, CA, Sep. 30, 1998, 4 pages.

"Virtual Memory Applications of the MU9C1480A LANCAM," Application Note AN-N3, Rev. 1a, Music Semiconductors, Milpitas, CA, Sep. 30, 1998, 12 pages.

"Using the MU9C1965A LANCAM MP for Data Wider than 128 Bits," Application Note AN-N19, Rev. 1a, Music Semiconductors, Milpitas, CA, Sep. 30, 1998, 16 pages.

"Fast IPv4 and IPv4 CIDR Address Translation and Filtering Using the MUAC Routing CoProcessor (RCP)," Application Note AN-N25, Rev. 0a, Music Semiconductors, Milpitas, CA, Oct. 1, 1998, 16 pages.

"Using MUSIC Devices and RCPs for IP Flow Recognition," Application Note AN-N27, Rev. 0, Music Semiconductors, Milpitas, CA, Oct. 21, 1998, 20 pages.

"Wide Ternary Searches Using Music CAMs and RCPs," Application Note AN-N31, Rev. 0, Music Semiconductors, Milpitas, CA, Apr. 13, 1999. 8 pages.

U.S. Appl. No. 10/196,763, filed Jul. 16, 2002, Patella et al.

U.S. Appl. No. 10/197,929, filed Jul. 16, 2002, Patella et al.

\* cited by examiner

METHOD AND APPARATUS FOR VERIFYING THE INTEGRITY OF A CONTENT-ADDRESSABLE MEMORY RESULT

FIELD OF THE INVENTION

This invention especially relates to content-addressable memory devices, and communications and computer systems that employ content-addressable memories; and more particularly, the invention relates to verifying the integrity of a result (e.g., index or application result) produced by a content-addressable memory, associative memory, or other device.

BACKGROUND OF THE INVENTION

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP).

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for access control lists (ACLs) and forwarding decisions is a demanding part of switch and router design. This packet classification of a received packet is increasingly becoming more difficult due to ever increasing packet rates and number of packet classifications. For example, ACLs require matching packets on a subset of fields of the packet flow label, with the semantics of a sequential search through the ACL rules. IP forwarding requires a longest prefix match.

One known approach uses binary and/or ternary content-addressable memories to perform packet classification. Ternary content-addressable memories allow the use of wildcards in performing their matching, and thus are more flexible than binary content-addressable memories.

However, content-addressable memories are made of storage elements that are subject to data errors. A corrupted bit or bits in an entry in a content-addressable memory ("CAM") can lead to an incorrect CAM result, and thus an error in routing, forwarding, quality of service or other characterization or application. Needed are mechanisms for verifying the integrity of a CAM result.

SUMMARY OF THE INVENTION

Systems and methods are disclosed verifying the integrity of a result produced by a content-addressable memory or other device. In one embodiment, an index is generated by a content-addressable memory based on an input value. A mask value and a data protection field are acquired based on the index. A comparison value is generated based on the mask value and the input value. The comparison value is compared to the data protection field. In one embodiment, a content-addressable memory index is received. A value field and a data protection field are extracted from the content-addressable memory index. A data protection function is performed on the value to generate a comparison result, and the comparison result is compared with the data protection field. In one embodiment, an index is generated by a content-addressable memory based on an input value. A comparison value is generated based on the index. A data protection field is acquired based on the index; and the comparison value is compared to the data protection field.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Methods and apparatus are disclosed for verifying the integrity of an index or result produced by a content-addressable memory, associative memory, or other device. Embodiments described herein include various elements and limitations, with no one element or limitation contemplated as being a critical element or limitation. Each of the claims individually recite an aspect of the invention in its entirety. Moreover, some embodiments described may include, but are not limited to, inter alia, systems, networks, integrated circuit chips, embedded processors, ASICs, methods, and computer-readable medium containing instructions. The embodiments described hereinafter embody various aspects and configurations within the scope and spirit of the invention, with the figures illustrating exemplary and non-limiting configurations.

As used herein, the term "packet" refers to packets of all types, including, but not limited to, fixed length cells and variable length packets, each of which may or may not be divisible into smaller packets or cells. Moreover, these packets may contain one or more types of information, including, but not limited to, voice, data, video, and audio information. Furthermore, the term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processors and systems, control logic, ASICs, chips, workstations, mainframes, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps and processing of signals and information illustrated in the figures are typically be performed in a different serial or parallel ordering and/or by different components in various embodiments in keeping within the scope and spirit of the invention. Moreover, the terms "network" and "communications mechanism" are used generically herein to describe one or more networks, communications mediums or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The terms "first," "second," etc. are typically used herein to denote different units (e.g., a first element, a second element). The use of these terms herein does not necessarily connote an ordering such as one unit or event occurring or coming before the another, but rather provides a mechanism to distinguish between particular units. Moreover, the phrase "based on x" is used to indicate a minimum set of items x from which something is derived, wherein "x" is extensible and does not necessarily describe a complete list of items on which the operation is based. Additionally, the phrase "coupled to" is used to indicate some level of direct or indirect connection between two elements or devices, with the coupling device or devices modify or not modifying the coupled signal or communicated information.

Methods and apparatus are disclosed for verifying the integrity of an index or result produced by a content-addressable or associated memory or other device. A pre-computed data protection field is stored, either as part of a returned index of a content-addressable memory or in a separate storage. In one embodiment, a data protection operation is performed on all or part of the returned index and a comparison is made with a pre-computed data protection field. In one embodiment, a copy of the masks employed by a ternary content-addressable memory and a set of pre-computed data protection fields are stored. A particular mask and pre-computed data protection field are selected based on the generated index. The original input value is then masked by the selected mask and provided to a data protection function. The result of this function is then compared to the selected pre-computed data protection field.

Figure 1:
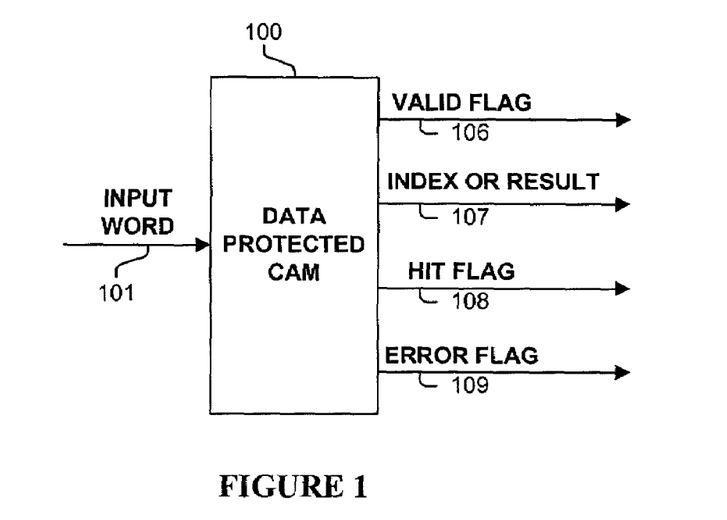
FIG. 1 is a block diagram of one embodiment of data protected CAM.
Figure 2:
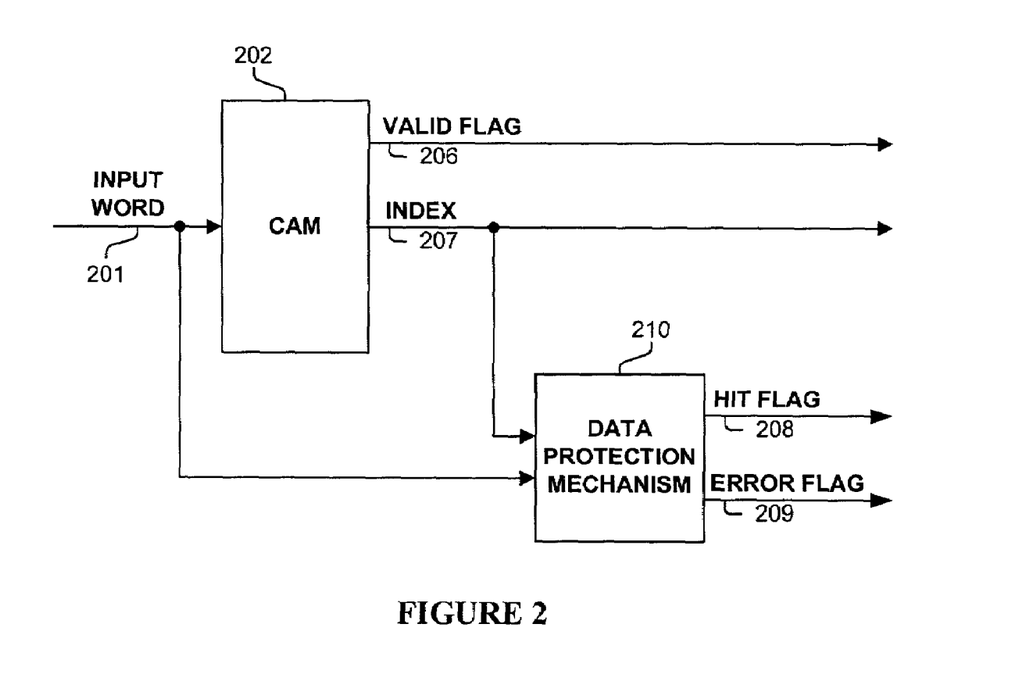
FIGS. 2, 3A–C and 4 are block diagrams of embodiments for protecting the integrity of an index (also referred to herein as a result, and vice versa) generated by a content-addressable memory.

Embodiments of the invention include, but are not limited to a single physical device having incorporated therein the data lookup and protection mechanisms as well as multiple components or physical devices. FIG. 1 illustrates one embodiment of a data protected content-addressable memory (CAM) 100, wherein the data protection functionality of the invention is included in a single device. FIG. 2 illustrates one embodiment which uses an adjunct data protection mechanism 210 (e.g., circuitry, processors, logic, etc.) for performing data protection functionality.

As shown in FIG. 1, data protected CAM 100 receives an input word 101 (e.g., any value or number of bits), and generates an index or result (e.g., ACL, forwarding, or other indication) 107, along with a valid flag 106, a hit flag 108 and error flag 109. Hit flag 108 is used to indicate whether a match was identified, and error flag 109 is used to indicate whether the produced index or result is valid. Valid flag 106 is used to identify when signals on index or result 107, hit flag 108, and error flag 109 indicate an actual result.

As shown in FIG. 2, CAM 202 receives an input word 201 and generates an index 207 (or result) which is provided to data protection mechanism 210. In some embodiments, input word 201 is also provided to data protection mechanism 210, while in some embodiments it is not. Data protection mechanism 210 controls the values of hit flag 208 which is used to indicate whether a match was identified, and of error flag 209 which is used to indicate whether the produced index or result is valid. Valid flag 206 is used to identify when signals on index 207, hit flag 208, and error flag 209 indicate an actual result.

Figure 3A:
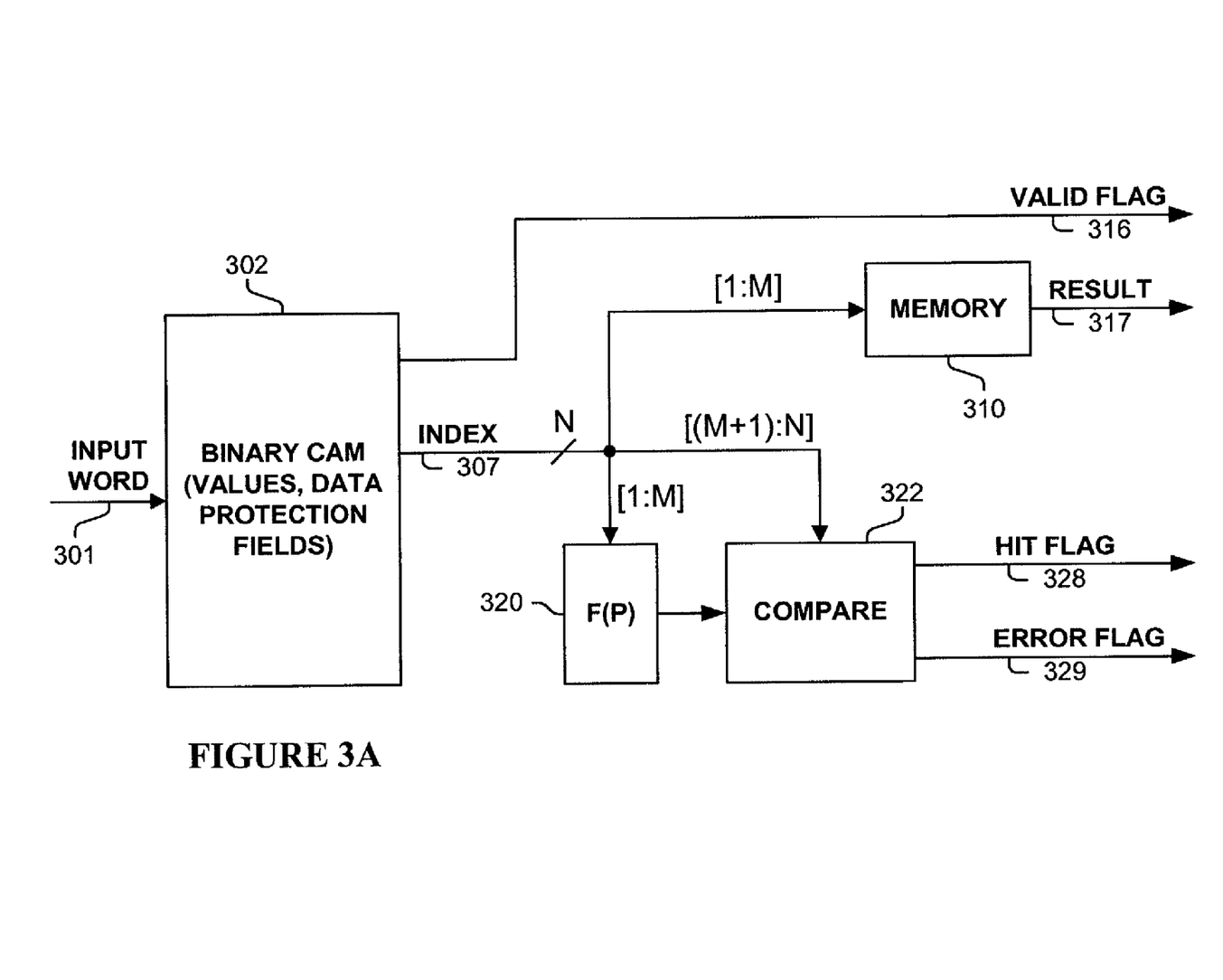

FIG. 3A illustrates one embodiment of a system for verifying the integrity of an index 307 generated by binary CAM 302 in response to received input word 301. In other embodiments, index 307 corresponds to a data result rather than a CAM index, and binary CAM may be another type of CAM, associative memory, or other device. As illustrated, binary CAM 302 stores a plurality of entries, wherein an entry typically contains a value and a data protection field, wherein the data protection field is a pre-computed data protection field (e.g., parity, some error correcting code, or other known or subsequently known data protection scheme) using the same data protection function as data protection generator 320.

In one embodiment, index 307 includes N bits, of which bits [1:M] correspond to the value, and bits [(M+1):N] correspond to a data protection field. The value bits of index 307 are typically used for processing corresponding to the desired application, such as retrieving a result 317 (e.g., a forwarding, routing, quality of service, or other indication) from a memory 310. The value bits of index 307 are provided to data protection generator 320, which produces a comparison value to compare mechanism 322. Compare mechanism 322 further receives the data protection bits of index 307, and makes a comparison. If these two values are equal, then compare mechanism 322 typically indicates a valid hit signal 328 and a no error signal 329. Otherwise, compare mechanism 322 typically indicates a no hit signal 328, and an error signal 329. Valid flag 316 is used to identify when signals on result 317, hit flag 328, and error flag 329 indicate an actual result.

Figure 3B:
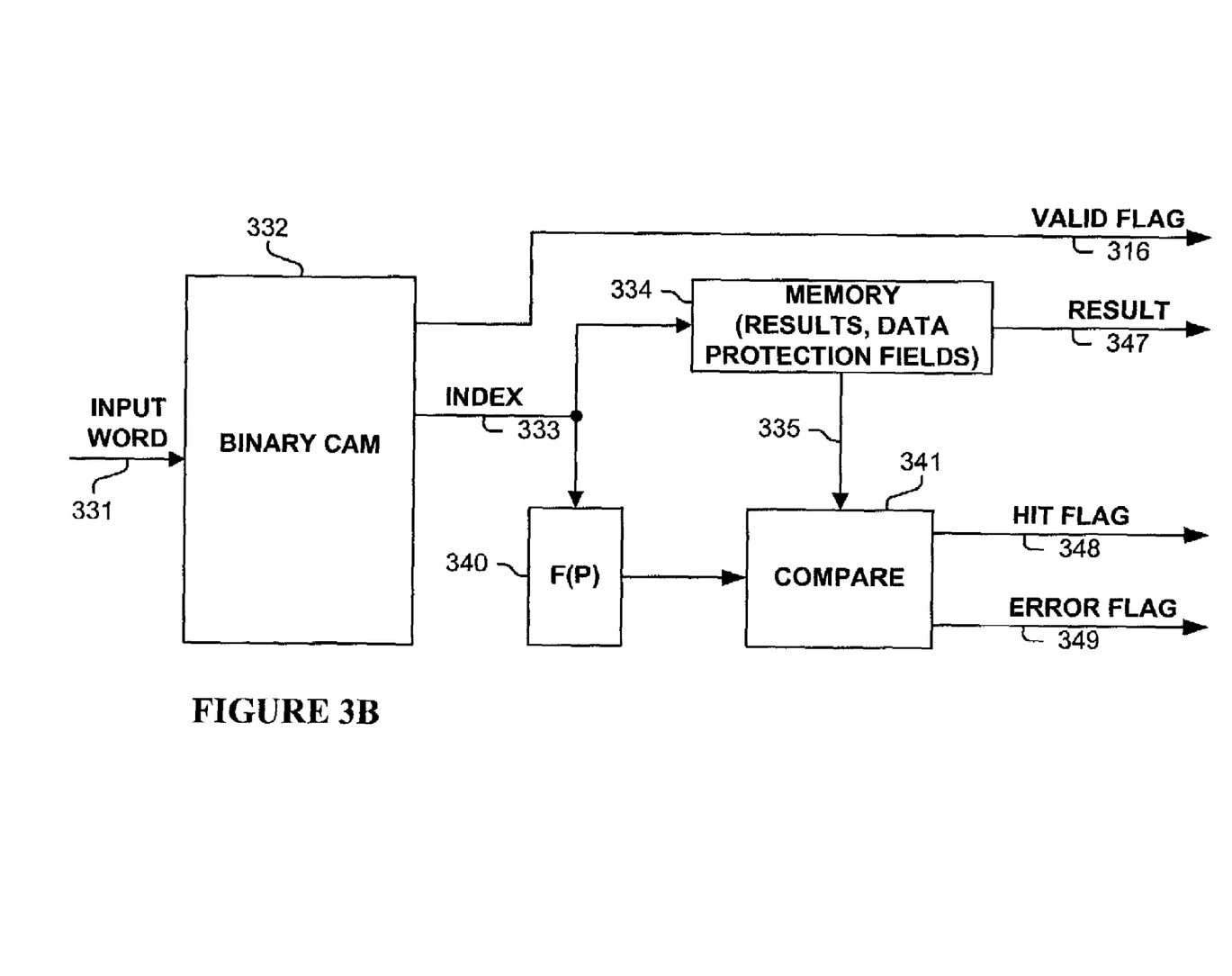

FIG. 3B illustrates a variation of the embodiment illustrated in FIG. 3A. Binary CAM 332 (or CAM, associative memory, or device) generates an index 333 (or other value) based on input word 331. Index 333 is provided to data protection generator 340 which provides a comparison signal to compare mechanism 341. Compare mechanism 341, or any other comparison mechanism described herein, can include any mechanism for comparing two or more signals or values, such as, but not limited to one or more comparators, sets of discrete logic, processors, and/or other methods or systems for comparing two values.

Index 333 is also provided to one or more memories 334, which retrieves a pre-computed data protection field 335 provided to compare mechanism 341, and optionally a result 347. If the comparison value pre-computed data protection field 335 are equal, then compare mechanism 341 typically indicates a valid hit signal 348 and a no error signal 349. Otherwise, compare mechanism 341 typically indicates a no hit signal 348, and an error signal 349. Valid flag 346 is used to identify when signals on result 347, hit flag 348, and error flag 349 indicate an actual result.

Figure 3C:
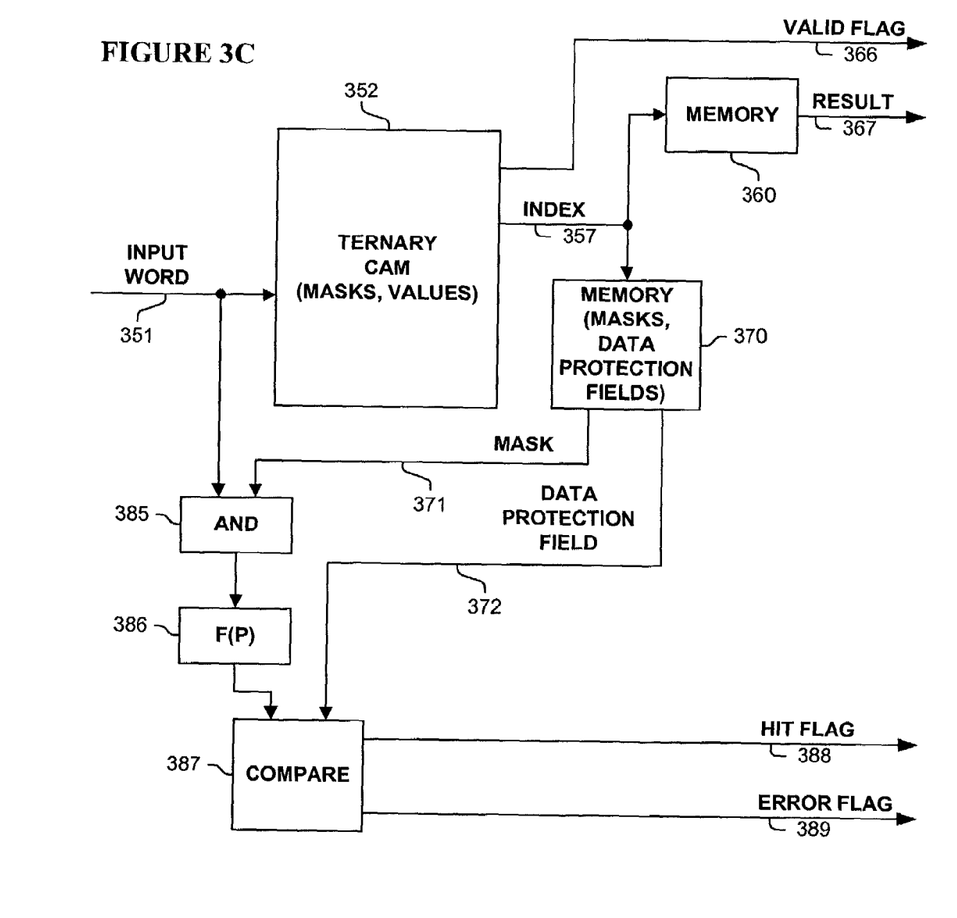

FIG. 3C illustrates one embodiment of a system for protecting the integrity of a ternary CAM 352 (or other CAM, associative memory, or device). In one embodiment, ternary CAM 352 maintains a set of masks and values. In some embodiments, the value bits for the masked bits, that is bits not participating in the compare, are set to zero or one. Based on an input word 351, ternary CAM 352, which may include an internal or external (not shown) priority encoder or other mechanism for selecting between multiple matches, produces an index 357. Index 357 is optionally used as input to a memory 360 or other device to produce a result 367 required for the particular application. Index 357 is also used by memory 370 (or other storage mechanism) to generate a mask 371 (corresponding to that used by the match to generate index 357) and a pre-computed data protection field 372. Input word 351 is then masked by AND device 385 using mask 371, with this result provided to data protection function 386, which produces a comparison result provided to compare mechanism 387. In one embodiment, data protection function 386 receives as input mask 371 directly, or via some other preprocessing step. In one embodiment, data protection function 386 receives the masked output of AND device 385 (and/or some other preprocessing step) as well as mask 371. Compare mechanism 387 compares this comparison value to the retrieved data protection field 372 to generate hit and error results as indicated by hit flag 388 and error flag 389. Valid flag 366 is used to identify when signals on result 367, hit flag 388, and error flag 389 indicate an actual result.

Figure 4:
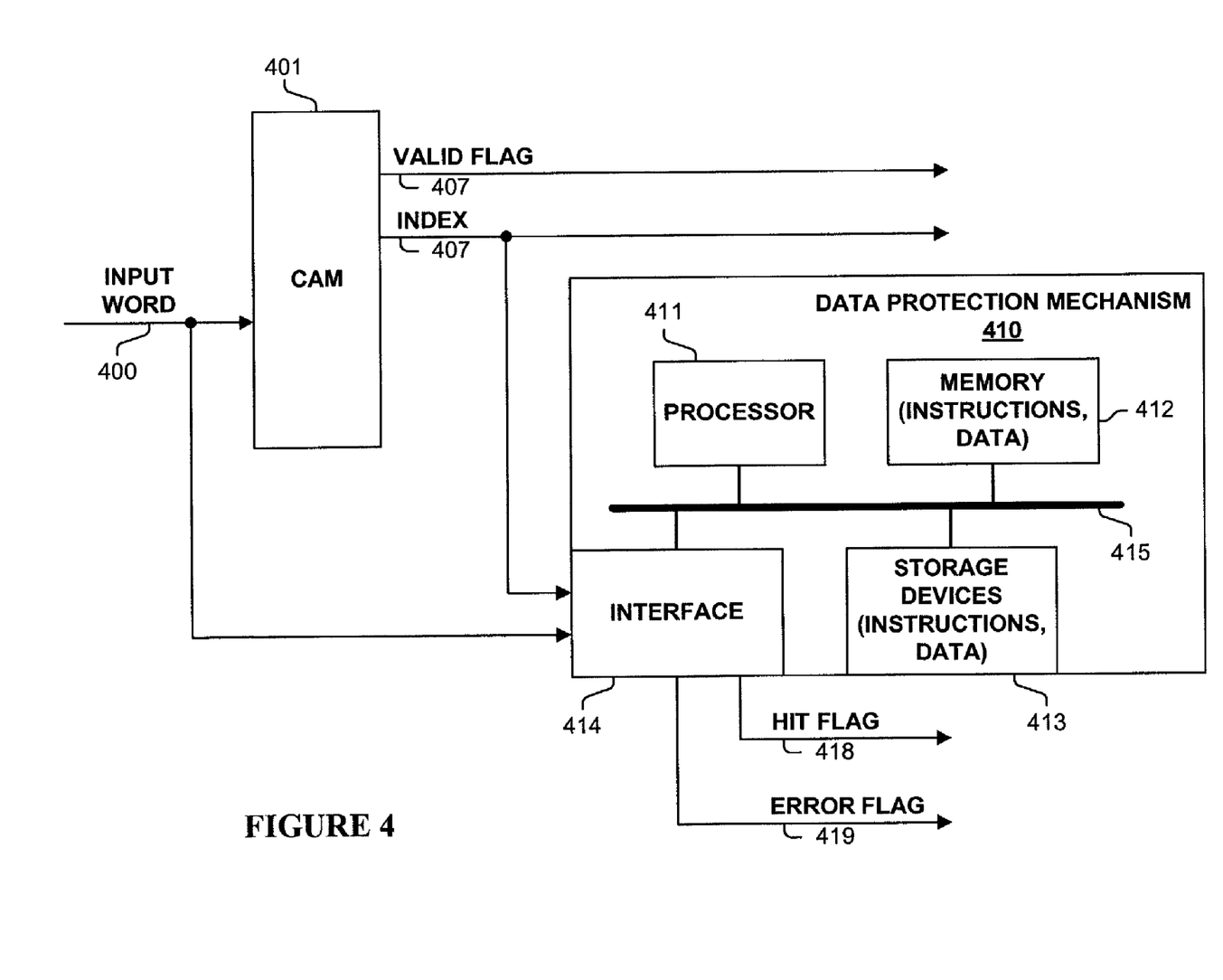

FIG. 4 illustrates another embodiment of a system for verifying the integrity of a result produced by a content-addressable memory 401 (binary, ternary or other CAM, associative memory, or device). CAM 401 produces an index 407 based on input word 400. Both input word 400 and index 407 are provided to interface 414 of data protection mechanism 410. Processor 411 manipulates the values of the received input word 400 and index 407 to determine the integrity of index 407, and to generate the integrity signals of hit flag 418 and error flag 419. Valid flag 406 is used to identify when signals on index 407, hit flag 418, and error flag 419 indicate an actual result.

Figure 5A:
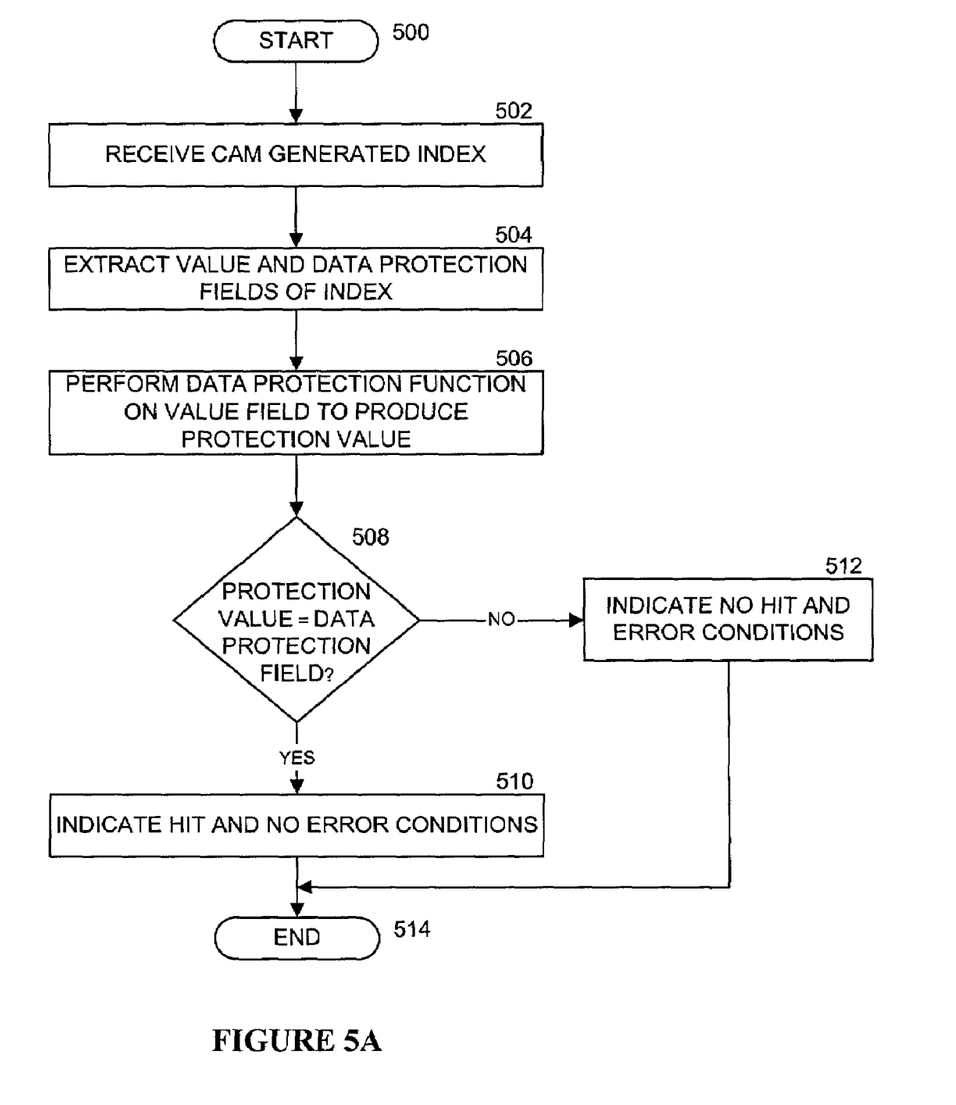
FIGS. 5A–C are flow diagrams of exemplary process used in some of numerous embodiments for protecting the integrity of an index generated by a content-addressable memory.
Figure 5B:
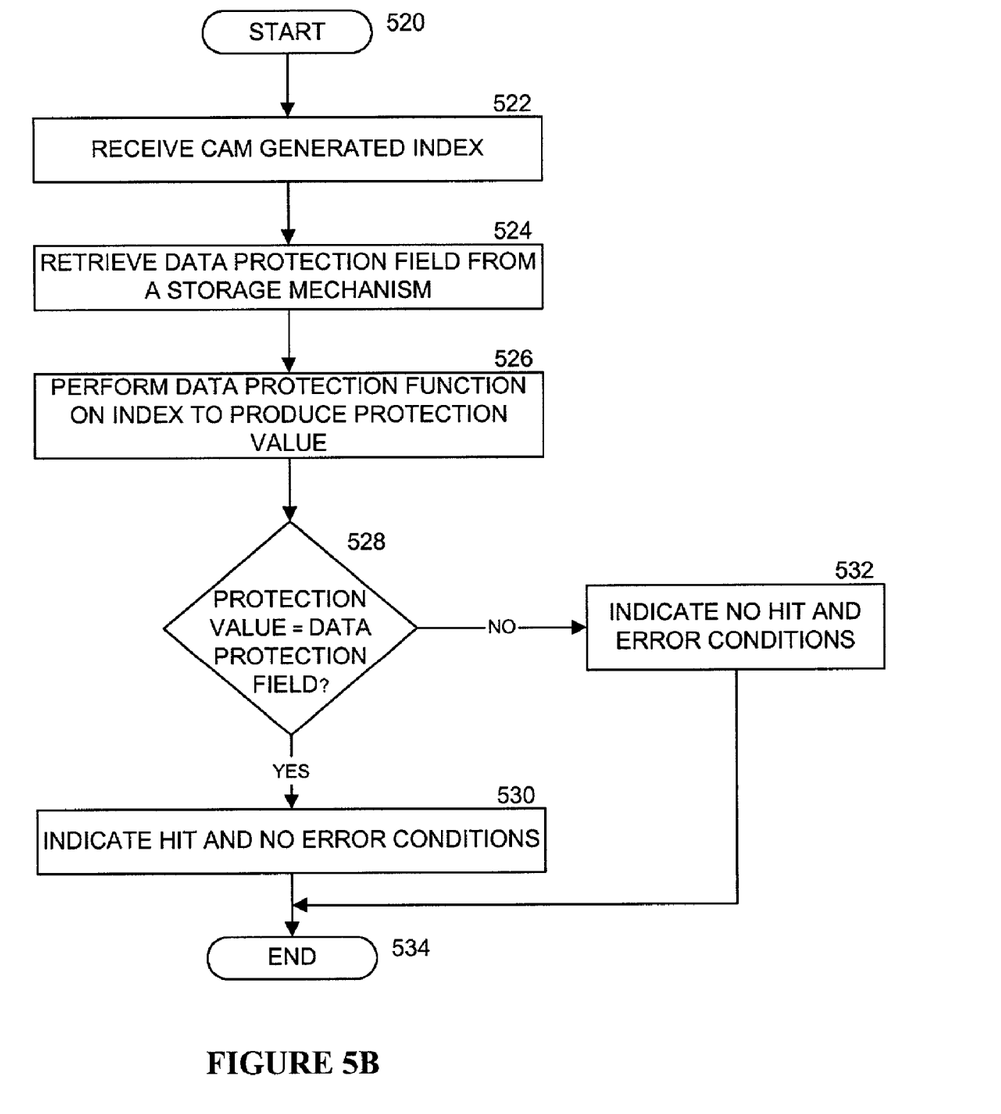
Figure 5C:
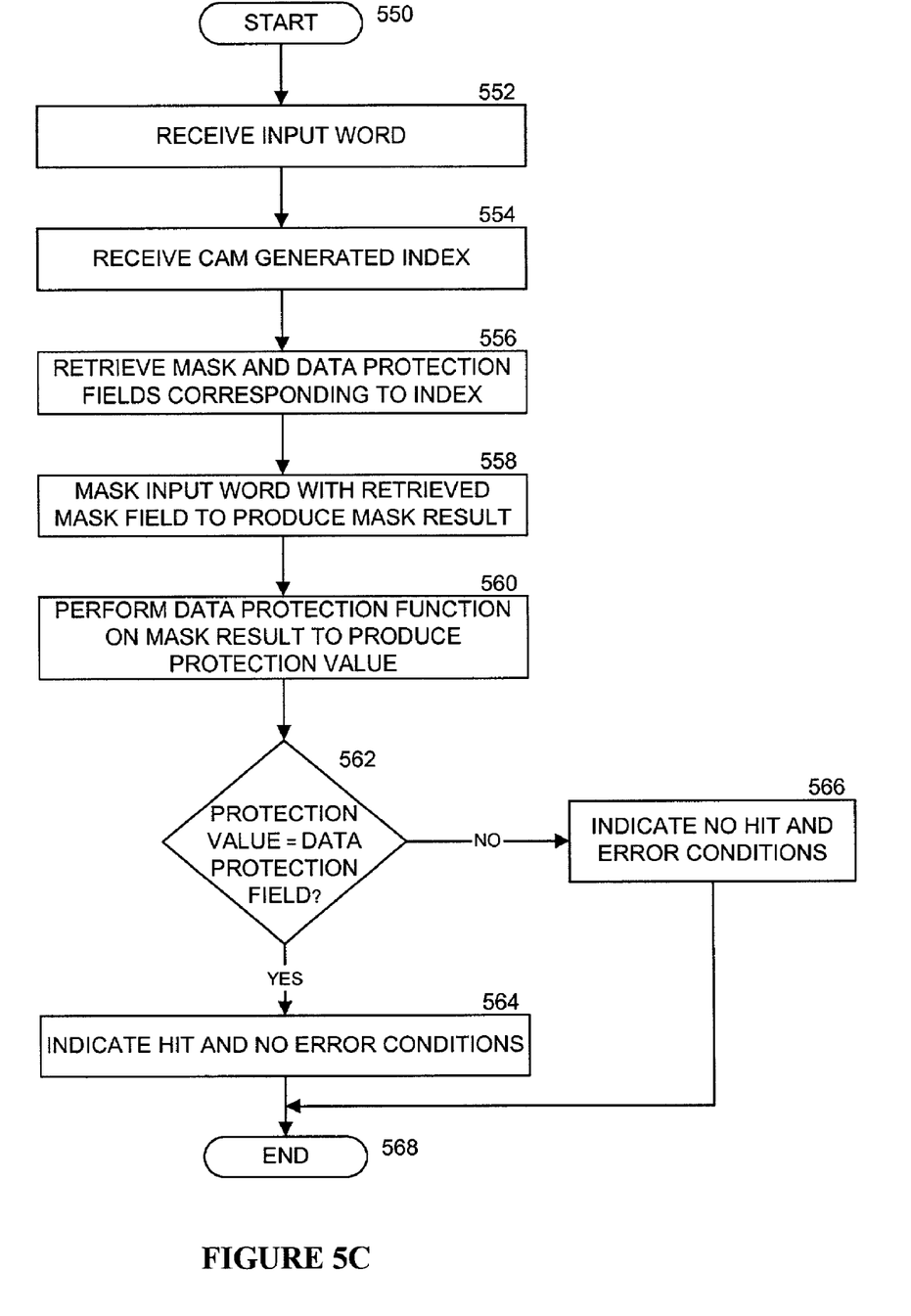

In one embodiment, data protection mechanism 410 includes a processor 411, memory 412, storage devices 413, and interface 414, which are electrically coupled via one or more communications mechanisms 415 (shown as a bus for illustrative purposes). Various embodiments of data protection mechanism 410 may include more or less elements. The operation of data protection mechanism 410 is typically controlled by processor 411 using memory 412 and storage devices 413 to perform one or more tasks or processes. Memory 412 is one type of computer-readable medium, and typically comprises random access memory (RAM), read only memory (ROM), integrated circuits, and/or other memory components. Memory 412 typically stores computer-executable instructions to be executed by processor 411 and/or data which is manipulated by processor 411 for implementing functionality in accordance with the invention. Storage devices 413 are another type of computer-readable medium, and typically comprise disk drives, diskettes, networked services, tape drives, and other storage devices. Storage devices 413 typically store computer-executable instructions to be executed by processor 411 and/or data which is manipulated by processor 411 for implementing functionality in accordance with the invention. FIGS. 5A–C describe several embodiments of processing performed by the embodiment illustrated in FIG. 4.

As used herein and contemplated by the invention, computer-readable medium is not limited to memory and storage devices; rather computer-readable medium is an extensible term which may include other tangible storage mechanisms.

FIG. 5A illustrates one process for verifying the integrity of a result produced by a content-addressable or associative memory or other device. Processing begins at process block 500, and proceeds to process block 502, wherein a CAM generated index is received. Next, in process block 504, the value and data protection fields of the index are extracted. In process block 506, a data protection function is performed on the value, with this result compared in process block 508 to the extracted data protection field. If these values are equal, then in process block 510, a hit and no error conditions are indicated. Otherwise, in process block 512, a no hit and error conditions are indicated. Processing of this index is completed as indicated by process block 514.

FIG. 5B illustrates one process for verifying the integrity of a result produced by a content-addressable or associative memory or other device. Processing begins at process block 520, and proceeds to process block 522, wherein a CAM generated index is received. Next, in process block 524, a data protection field is retrieved from a storage mechanism (e.g., SRAM, memory, disk, etc.). Next, in process block 526, a data protection function is performed on the index, with this result compared in process block 528 to the retrieved data protection field. If these values are equal, then in process block 530, a hit and no error conditions are indicated. Otherwise, in process block 532, a no hit and error conditions are indicated. Processing of this index is completed as indicated by process block 534.

FIG. 5C illustrates one process for verifying the integrity of a result produced by a content-addressable or associative memory or other device. Processing begins at process block 550, and proceeds to process block 552, wherein the input word to the content-addressable memory is received. In process block 554, the CAM generated index is received. In process block 556, the mask and data protection fields corresponding to the index are retrieved, typically from a storage mechanism. Next, in process block 558, the input word is masked using the retrieved mask, with a data protection function being applied to this mask result to generate a protection value in process block 560. If, as determined in process block 562 that the protection value equals the value of the retrieved data protection field, then in process block 564, a hit and no error conditions are indicated. Otherwise, in process block 566, a no hit and error conditions are indicated. Processing of this index is completed as indicated by process block 568.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method comprising:
generating an index by a content-addressable memory based on an input value;

acquiring a mask value and a data protection field based on the index;

generating a comparison value based on the mask value and the input value; and comparing the comparison value to the data protection field in order to determine the integrity of a result of the content-addressable memory associated with the index.

2. The method of claim 1, wherein the data protection field includes a pre-computed data protection result.

3. The method of claim 1, wherein the content-addressable memory includes a ternary content-addressable memory.

4. The method of claim 1, wherein said acquiring the mask value and the data protection field includes a lookup operation on a memory.

5. The method of claim 1, wherein generating the comparison value includes:

masking the input value with the mask value to generate a masked input value; and applying a data protection function to the masked input value to generate the comparison value.

6. The method of claim 1, wherein generating the comparison value includes:

decoding the mask value to generate a decoded mask value;

masking the input value with the decoded mask value to generate a masked input value; and applying a data protection function to the masked input value to generate the comparison value.

7. The method of claim 1, wherein generating the comparison value includes:

masking the input value with the mask value to generate a masked input value; and applying a data protection function to the masked input value to generate the comparison value.

8. The method of claim 1, wherein the input value has a plurality of input value bits, and the content-addressable memory includes a plurality of pairs of masks and values with each mask each having a plurality of mask bits and each value having a plurality of value bits; and wherein said generating the index includes matching the input value with a particular one of the plurality of pairs of masks and values, wherein said matching includes comparing said input value bits whose corresponding said mask bits of the particular one of the plurality of pairs have a scalar value of one with said value bits of the particular one of the plurality of pairs whose corresponding said mask bits of the particular one of the plurality of pairs have a scalar value of one.

9. The method of claim 1, wherein the input value has a plurality of input value bits, and the content-addressable memory includes a plurality of pairs of masks and values with each mask each having a plurality of mask bits and each value having a plurality of value bits; and wherein said generating the index includes matching the input value with a particular one of the plurality of pairs of masks and values, wherein said matching includes comparing said input value bits whose corresponding said mask bits of the particular one of the plurality of pairs have a scalar value of zero with said value bits of the particular one of the plurality of pairs whose corresponding said mask bits of the particular one of the plurality of pairs have a scalar value of zero.

10. The method of claim 1, further comprising signaling an error condition if the comparison value is not equal to the data protection field.

11. The method of claim 1, wherein said acquiring the mask value includes:

retrieving an encoded mask value from a storage mechanism; and decoding the encoded mask value to generate the mask value.

12. The method of claim 1, wherein the index includes an identification of a position of an entry in the content-addressable memory matching the input value.

13. A computer-readable medium containing computer-readable instructions for performing a set of steps, the set of steps comprising:

retrieving a mask value and a data protection field from a storage based on an index value generated by a content-addressable memory based on an input value;

masking the input value with the mask value to generate a masked input value;

performing a data protection function on the masked input value to generate a comparison result; and comparing the comparison result with the data protection field in order to identify whether or not there was a data protection error.

14. The computer-readable medium of claim 13, wherein the storage includes one or more memory devices.

15. The computer-readable medium of claim 13, wherein the storage includes one or more storage devices.

16. The computer-readable medium of claim 13, wherein the content-addressable memory includes a ternary content-addressable memory.

17. The computer-readable medium of claim 13, wherein the data protection field includes a pre-computed data protection result.

18. The computer-readable medium of claim 13, further indicating an error condition if the comparison value is not equal to the data protection field.

19. The computer-readable medium of claim 13, wherein the index value includes an identification of a position of an entry in the content-addressable memory matching the input value.

20. An apparatus comprising:

a content-addressable memory configured to receive an input word and to generate an index;

one or more storage mechanisms coupled to the content-addressable memory to receive the index and to produce a mask value and a data protection field;

a masking device coupled to said one or more storage mechanisms to generate a masked result based on the input word and the mask value;

a data protection generator coupled to the masking device to generate a comparison value based on the masked result; and a comparison mechanism coupled to the data protection generator and said one or more storage mechanisms to compare the comparison value and the data protection field in order to identify whether or not there was a data protection error.

21. The apparatus of claim 20, wherein the masking device includes a decoder to decode the mask value.

22. The apparatus of claim 20, wherein the comparison mechanism indicates an error condition if the comparison value is not equal to the data protection field.

23. The apparatus of claim 20, wherein the data protection field includes a pre-computed data protection result.

24. The apparatus of claim 20, wherein the content-addressable memory includes a ternary content-addressable memory.

25. The apparatus of claim 20, wherein the index includes an identification of a position of an entry in the content-addressable memory matching the input value.

26. An apparatus comprising:
a content-addressable memory including a plurality of entries, each of the plurality of entries including a value and a data protection field, wherein the content-addressable memory is configured to identify one of the plurality of entries in response to a look operation on an input word;
a data protection generator, coupled to the content-addressable memory, to receive said value of said identified one of the plurality of entries and to generate a comparison value; and
a comparison mechanism, coupled to the data protection generator and the content-addressable memory, configured to compare the comparison value and said data protection field of the identified one of the plurality of entries in order to identify whether or not there was a data protection error.

27. The apparatus of claim 26, wherein the content-addressable memory includes a binary content-addressable memory.

28. The apparatus of claim 26, wherein, for each of the plurality of entries, said data protection field of a particular entry includes a pre-computed data protection result for said value of the particular entry.

29. A method comprising:
receiving a content-addressable memory index generated based on a lookup operation in a content-addressable memory on an input word, the content-addressable memory index including a value field and a data protection field;
extracting the value field and the data protection field from the content-addressable memory index;
performing a data protection function on the value field to generate a comparison result; and
comparing the comparison result with the data protection field in order to identify whether or not there was a data protection error.

30. The method of claim 29, wherein the content-addressable memory includes a binary content-addressable memory.

31. The method of claim 29, wherein the data protection field includes a pre-computed data protection result.

32. The method of claim 29, further indicating an error condition if the comparison result is not equal to the data protection field.

33. An apparatus comprising:
a content-addressable memory configured to receive an input word and to generate an index;
a memory, coupled to the content-addressable memory and a comparison mechanism, to receive at least a first portion of the index generated by the content-addressable memory and to retrieve a data protection field from a location identified based on the index;
a data protection generator, coupled to the content-addressable memory and the comparison mechanism, configured to receive at least a second portion of the index generated by the content-addressable memory and to generate a comparison value based on the index; and
the comparison mechanism configured to compare the comparison value generated by the data protection generator and the data protection field retrieved from the memory in order to identify whether or not there was a data protection error.

34. The apparatus of claim 33, wherein the content-addressable memory includes a binary content-addressable memory.

35. A method comprising:
generating an index by a content-addressable memory based on an input value, the index identifying a matching entry of the content-addressable memory;
generating a comparison value by a data protection generator based at least on a portion of the index received from the content-addressable memory;
acquiring a data protection field from a memory the data protection field being retrieved from an address based at least on a portion of the index received from the content-addressable memory; and
comparing the comparison value generated by the data protection generator to the data protection field acquired from the memory to identify whether or not an error exists.

36. The method of claim 35, wherein the data protection field includes a pre-computed data protection result.

37. The method of claim 35, wherein the content-addressable memory includes a binary content-addressable memory.

38. The method of claim 35, wherein said acquiring the data protection field includes a lookup operation on a memory.

39. The method of claim 35, wherein generating the comparison value includes applying a data protection function to the index.

40. The method of claim 35, further comprising signaling an error condition if the comparison value is not equal to the data protection field.

41. An apparatus comprising:
means for generating an index by a content-addressable memory based on an input value;
means for acquiring a mask value and a data protection field based on the index;
means for generating a comparison value based on the mask value and the input value; and
means for comparing the comparison value to the data protection field in order to identify whether or not an error exists.

42. The apparatus of claim 41, wherein the data protection field includes a pre-computed data protection result.

43. The apparatus of claim 41, wherein the content-addressable memory includes a ternary content-addressable memory.

44. The apparatus of claim 41, wherein said means for acquiring the mask value and the data protection field includes means for performing a lookup operation on a memory.

45. The apparatus of claim 41, wherein said means for generating the comparison value includes:
means for masking the input value with the mask value to generate a masked input value; and
means for applying a data protection function to the masked input value to generate the comparison value.

46. The apparatus of claim 44, wherein said means for comparing includes means for indicating an error condition if the comparison value is not equal to the data protection field.

47. The apparatus of claim 44, wherein the data protection field includes a pre-computed data protection result.

48. An apparatus comprising:
means for receiving an input word and for generating an index;

means for receiving the index and for producing a mask value and a data protection field;

means for generating a masked result based on the input word and the mask value;

means for generating a comparison value based on the masked result; and means for comparing the comparison value and the data protection field in order to identify whether or not an error exists.

49. The apparatus of claim 48, wherein said means for generating a masked result includes means for decoding the mask value.

50. The apparatus of claim 48, wherein said means for comparing includes means for indicating an error condition if the comparison value is not equal to the data protection field.

51. The apparatus of claim 48, wherein the data protection field includes a pre-computed data protection result.

52. The apparatus of claim 48, wherein said means for receiving the input word and for generating the index includes a content-addressable memory.

53. The apparatus of claim 48, wherein said means for receiving the input word and for generating the index includes a ternary content-addressable memory.

54. An apparatus comprising:
means for receiving an index and for producing a value and a data protection field based on the index;
means for generating a comparison value based on the value; and
means for comparing the comparison value to the data protection field in order to identify whether or not an error exists.

55. The apparatus of claim 54, wherein said means for receiving the index and for producing the value and the data protection field includes a binary content-addressable memory.

56. The apparatus of claim 55, wherein the data protection field includes a pre-computed data protection result for the value.

57. An apparatus comprising:
means for generating an index based on an input value to a content-addressable memory identifying a matching entry of the content-addressable memory;
means for generating a comparison value based on the index received from the content-addressable memory;
means for acquiring a data protection field from a memory based on the index received from the content-addressable memory; and
means for comparing the comparison value generated by said means for generating the comparison value to the data protection field acquired by said means for acquiring the data protection field in order to identify whether or not an error exists.

58. The apparatus of claim 57, wherein said means for generating the index based on the input value includes a binary content-addressable memory.

59. The apparatus of claim 57, wherein said means for acquiring the data protection field includes means for performing lookup operation on a memory.

60. The apparatus of claim 57, further comprising means for signaling an error condition if the comparison value is not equal to the data protection field.

61. A computer-readable medium containing computer-executable instructions for performing operations, said operations comprising:
receiving a content-addressable memory index;
extracting a value field and a data protection field from the content-addressable memory index;
performing a data protection function on the value to generate a comparison result; and
comparing the comparison result with the data protection field in order to identify whether or not an error exists.

62. The computer-readable medium of claim 61, wherein the content-addressable memory includes a binary content-addressable memory.

63. The computer-readable medium of claim 61, wherein the data protection field includes a pre-computed data protection result.

64. The computer-readable medium of claim 61, further indicating an error condition if the comparison result is not equal to the data protection field.

65. An apparatus comprising:
a content-addressable memory configured to receive an input word and to perform a content-addressable memory lookup operation in order to generate a data result for the input word, the data result including a value and a data protection field of an entry in the content-addressable memory matching the input value;
a data protection generator, coupled to the content-addressable memory, configured to generate a comparison data protection value based on the value; and
a comparison mechanism, coupled to both of the data protection generator and the content-addressable memory, configured to compare the comparison data protection value and the data protection field in order to identify whether or not there was a data protection error for said content-addressable memory lookup operation.

66. The apparatus of claim 65, wherein the comparison mechanism indicates an error condition if the comparison data protection value is not equal to the data protection field.

* * * * *

UNITED STATES PATENT AND TRADEMARK OFFICE
CERTIFICATE OF CORRECTION

PATENT NO. : 7,260,673 B1 Page 1 of 1
APPLICATION NO. : 09/910227
DATED : August 21, 2007
INVENTOR(S) : Ross It is certified that error appears in the above-identified patent and that said Letters Patent is hereby corrected as shown below:

Col. 10, Replace claim 46 with the following:
-- 46. The apparatus of claim 41, wherein said means for generating the comparison value includes:
  means for decoding the mask value to generate a decoded mask value;
  means for masking the input value with the decoded mask value to generate a masked input value; and
  means for applying a data protection function to the masked input value to generate the comparison value. --

Col. 10, Replace claim 47 with the following:
-- 47. The apparatus of claim 41, further comprising means for signaling an error condition if the comparison value is not equal to the data protection field. --

Col. 11, Claim 56, replace "apparatus of claim 55" with -- apparatus of claim 54 --

Signed and Sealed this

Fifth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,260,673 B1                                                   Page 1 of 1
APPLICATION NO. : 09/910227
DATED : August 21, 2007
INVENTOR(S) : Ross It is certified that error appears in the above-identified patent and that said Letters Patent is hereby corrected as shown below:

Col. 10, lines 59-62, Replace claim 46 with the following:
-- 46. The apparatus of claim 41, wherein said means for generating the comparison value includes:
    means for decoding the mask value to generate a decoded mask value;
    means for masking the input value with the decoded mask value to generate a
        masked input value; and
    means for applying a data protection function to the masked input value to
        generate the comparison value. --

Col. 10, lines 63-64, Replace claim 47 with the following:
-- 47. The apparatus of claim 41, further comprising means for signaling an error condition if the
    comparison value is not equal to the data protection field. --

Col. 11, Claim 56, line 37, Replace "apparatus of claim 55" with -- apparatus of claim 54 --

This certificate supersedes the Certificate of Correction issued January 5, 2010.

Signed and Sealed this

Twenty-sixth Day of January, 2010

David J. Kappos
*Director of the United States Patent and Trademark Office*